United States Patent [19]
Palagonia

[11] Patent Number: 6,160,302
[45] Date of Patent: Dec. 12, 2000

[54] LASER FUSIBLE LINK

[75] Inventor: Anthony M. Palagonia, Underhill, Vt.

[73] Assignee: International Business Machines Corporation, Armonk, N.Y.

[21] Appl. No.: 09/143,983

[22] Filed: Aug. 31, 1998

[51] Int. Cl.[7] ................................. H01L 29/72
[52] U.S. Cl. .................. 257/529; 257/630; 257/659; 257/660
[58] Field of Search .................. 257/529, 630, 257/659, 660

[56] References Cited

U.S. PATENT DOCUMENTS 5,747,869  5/1998  Prall et al. .......................... 257/529

*Primary Examiner*—Edward Wojciechowicz
*Attorney, Agent, or Firm*—McGinn & Gibb, P.C.; Daryl K. Neff, Esq.

[57] ABSTRACT

A structure (and method) for selectively making an electrical connection comprising a conductive element, wherein the conductive element becomes non-conductive after application of radiation energy, and a reflective element, positioned adjacent at least two sides of the conductive element for reflecting the radiation energy.

32 Claims, 5 Drawing Sheets

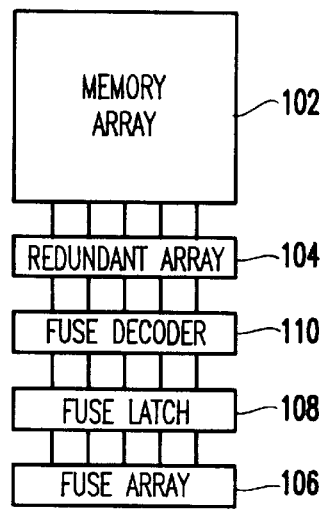
FIG.1
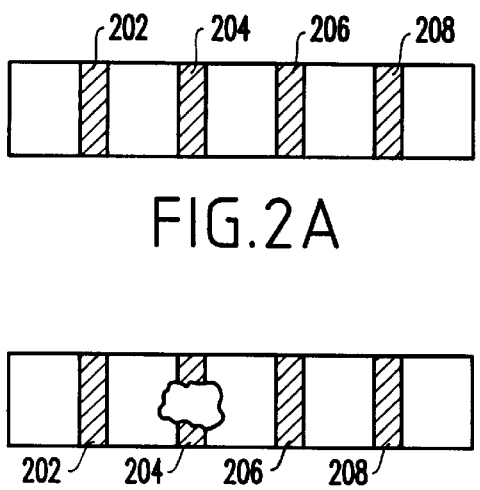
FIG.2A
FIG.2B
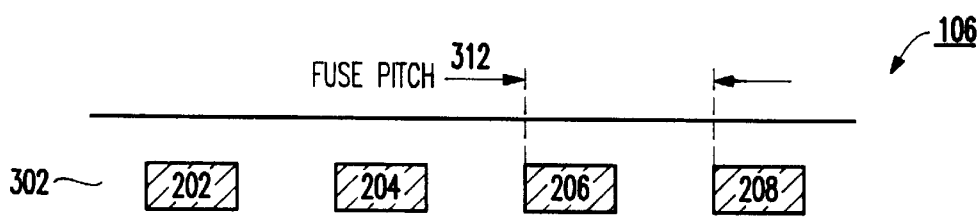
FIG.3A
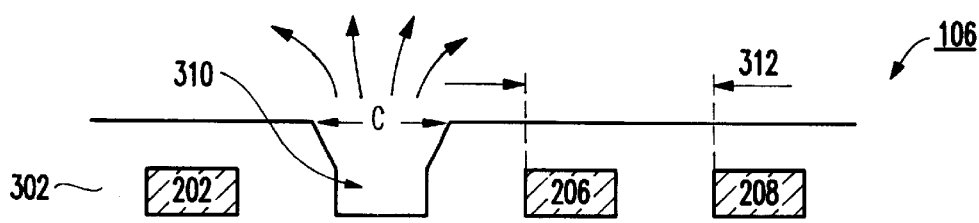
FIG.3B

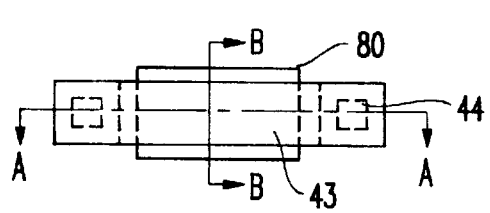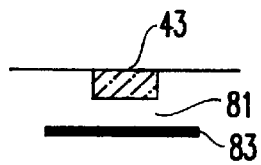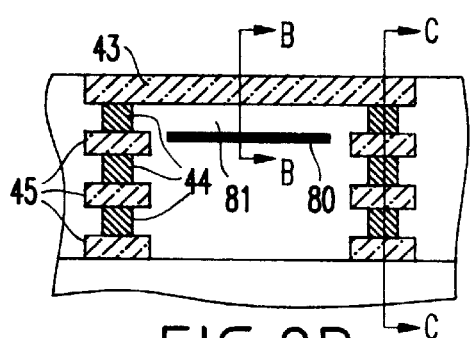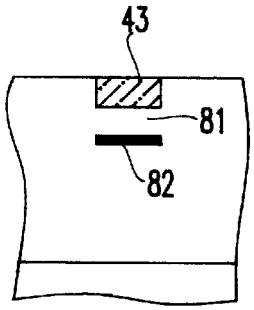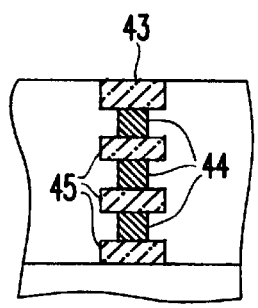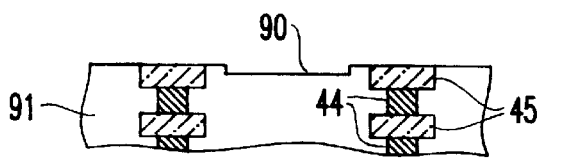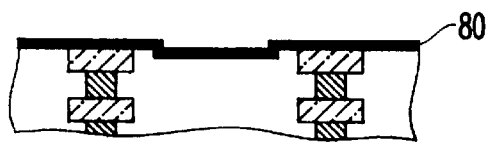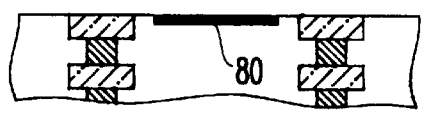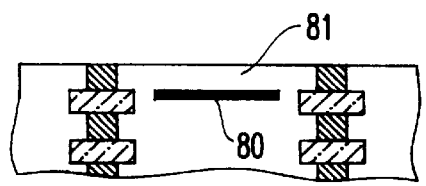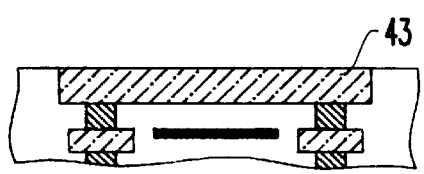

LASER FUSIBLE LINK

BACKGROUND OF THE INVENTION

1. Field of the Invention

The present invention relates to the fabrication of integrated circuits. More particularly, the present invention relates to improved techniques for increasing circuit density and/or reducing substrate damage in an integrated circuit employing laser fusible links.

2. Description of Related Art

Semiconductor integrated circuits (IC) and their manufacturing techniques are well known. In a typical integrated circuit, a large number of semiconductor devices may be fabricated on a silicon substrate. To achieve the desired functionality, a plurality of conductors are typically provided to couple selected devices together. In some integrated circuits, conductive links are coupled to fuses, which may be cut or blown after fabrication using lasers. In a dynamic random access memory (DRAM) circuit, for example, fuses may be employed to replace failing memory array elements with redundant array elements. In logic circuits, fuses may be used to select or modify circuit performance or functions. Laser fusible links comprise metal lines that can be explosively fused open by application of laser energy which causes a portion of the link material to vaporize and a portion to melt. Typically, the fusible link is thin and composed of aluminum or polysilicon. Or it may be made of the same metals as the chip conductors. In operation a short pulse of laser energy in predetermined arcs (spot) is impinged upon the link.

Since every link is not necessarily blown, it is important to ensure that adjacent fuses are not blown by reflected light. Two methods are currently used to ensure that only the desired fuses are blown and that adjacent fuses are not inadvertently blown. The first method simply spaces the fuses two or three spot diameters apart. The second method builds metal walls between the adjacent fuses. Both those methods result in large fuse pitches and significant use of chip area.

In cases where the fusible links are built from the same material as the chip conductors, become thicker, are made of composite layers including layers of refractory metals (Tungsten and various suicides), or are comprised of highly reflective metals (copper), blowing the fuses with lasers becomes more difficult.

The increasing speed requirements of logic chips are the driving force behind these fusible link materials. More commonly, fuses may be employed to set the enable bit and the address bits of a redundant array element in a DRAM circuit.

FIG. 1 illustrates a typical dynamic random access memory integrated circuit, having a main memory array 102. To facilitate replacement of a defective main array element within the main memory array 102, a redundant array 104 is provided as shown. A plurality of fuses in fuse array 106 are coupled to redundant array 104 via a fuse latch array 108 and a fuse decoder circuit 110. To replace a defective main memory array element, individual fuses in fuse array 106 may be blown or cut to set their values to either a "1" or a "0" as required by the decoder circuit 110.

During operation, the values of the fuses in fuse array 106 are typically loaded into fuse latch array 108 upon power up. These values are then decoded by fuse decoder circuit 110 during run time, thereby facilitating the replacement of specific failed main memory array elements with specific redundant elements of redundant array 104. Techniques for replacing failed main memory array elements with redundant array elements are well known in the art and will not be discussed in great detail here.

As mentioned earlier, the fuse links within fuse array 106 may be selectively blown or cut with a laser beam. Once blown by the laser beam, the fuse changes from a highly conductive state to a highly resistive (i.e., non-conductive) state. A blown fuse inhibits current from flowing through and represents an open circuit to the current path. With reference to FIG. 2A, fuse links 202, 204, 206, and 208 of fuse array element 106 are shown in their unblown (i.e., conductive) state. In FIG. 2B, a laser beam has been employed to cut or blow fuse link 204, thereby inhibiting the flow of current there through.

It has been found that the use of a laser beam to set, cut or blow a fuse link may render the area under the fuse link or adjacent fusible links vulnerable to laser-induced damage, mainly due to the absorption of laser energy during the fuse setting operation. Because of the possibility of laser-induced damage, the areas underlying the fuse links are typically devoid of semiconductor devices (e.g., transistors) and the fuses are spaced far apart in conventional systems.

Even when there are no active devices beneath the fusible link or other closely spaced fusible links, the substrate itself may also experience some degree of laser-induced damage. This is because silicon, which is the typical substrate material, absorbs the laser energy readily, particularly when short wavelength lasers are employed. For this reason, lasers having relatively long wavelengths such as infrared lasers have been employed in conventional systems for the fuse setting operation.

Even though infrared lasers are helpful in minimizing laser-induced damage to the underlying substrate, the use of lasers having relatively long wavelengths involves certain undesirable compromises. By way of example, the relatively long wavelength of the infrared laser forms a relatively large spot on the substrate during the fuse setting operation, which limits how closely the fuse links can be packed next to one another. For infrared lasers having a wavelength of, for example, about 1micron, the spot created on the substrate may be two times the wavelength or about 2 to 2.5 microns wide.

The disadvantages associated with lasers having relatively long wavelengths is illustrated with reference to FIGS. 3A and 3B below. FIG. 3A is a cross-sectional view of a portion of fuse array 106, including fuse links 202, 204, 206, and 208. In FIG. 3A, fuse links 202, 204, 206, and 208 are shown encapsulated within a passivation layer 302. A substrate 304 underlies the fuse links as shown. It should be noted that the illustration of FIG. 3A is highly simplified to facilitate illustration and fuse array 106 may include other conventional layers and/or components as is known.

In FIG. 3B, fuse link 204 of FIG. 3A has been blown or cut using a laser beam. In place of fuse link 204, a void 310 exists, whose diameter C is roughly twice the wavelength of the laser beam employed. The diameter C of the laser spot places a lower limit on the minimum fuse pitch 312 between adjacent fuse links. If the fuses are placed too closely together for a given laser wavelength, an adjacent fuse link may be inadvertently blown or cut, rendering the IC defective.

Using a laser with a shorter wavelength would reduce the diameter C of the laser spot and concomitantly the minimum fuse pitch. However, a shorter wavelength laser substantially increases the likelihood of underlying substrate damage in conventional systems since the silicon substrate absorbs laser energy from shorter wavelength lasers much more readily. If a shorter wavelength laser is employed to set the fuse links of conventional systems fuse array 106, excessive substrate damage in area 320 of substrate 304 may result, possibly leading to integrated circuit defects and failure.

In view of the foregoing, there is a conventional need for improved techniques for fabricating integrated circuits having laser fusible links. More particularly, there is a conventional need for improved laser fuse link structures and methods therefor, which advantageously minimize substrate damage during the fuse setting operation and/or permit the use of shorter wavelength lasers to reduce the fuse pitch.

SUMMARY OF THE INVENTION

This invention provides solutions to the problems discussed in the previous section. With the invention, laser energy is reflected from the sidewalls of and bottom of adjacent fuses. Further, thick fuses or fuses having a lower layer consisting of a refractory metal are more easily blown with the invention.

More specifically, the invention includes a structure (and method) for selectively making an electrical connection comprising a conductive element, wherein the conductive element becomes non-conductive after application of radiation energy, and a reflective element, positioned adjacent at least two sides of the conductive element for reflecting the radiation energy.

The conductive element comprises a laser fusible link and the radiation energy comprises laser light. The reflective element either substantially surrounds opposing sides and a bottom of the conductive element or is positioned around opposing sides of the conductive element.

The conductive element has a first melting point and the reflective element has a second melting point higher than the first melting point. The conductive element comprises one of aluminum, an aluminum alloy and polysilicon and the reflective element comprises one of silver, rhodium, gold, copper, platinum, tantalum, nickel, zirconium oxide 84%, aluminum oxide 88%, silicon and polysilicon.

The invention also includes an insulating layer positioned between the conductive element and the reflective element. The insulating layer has a thickness equal to a whole multiple of a wavelength of the radiation energy.

By providing reflective material surrounding the fuse links, the adjacent fuses and devices below the fuses are protected from laser-induced damage when a laser beam is employed to open a given laser fuse links. With reduced damage to adjacent fuse links and underlying layer, the areas underlying the laser fuse links and the shielding portions may be employed to implement semiconductor devices (e.g., transistors, capacitors, and the like), thereby increasing circuit density. Further, with the invention, fuse links may be more closely spaced (e.g., lower pitch), which increases the fuse link density, because adjacent fuses are prevented from being damaged.

BRIEF DESCRIPTION OF THE DRAWINGS

The present invention is illustrated by way of example, not by way of limitation, in the figures of the accompanying drawings and in which like reference numerals refer to like elements and in which:

FIG. 1 illustrates a typical dynamic random access memory (DRAM) integrated circuit to facilitate discussion;

FIG. 2A illustrates a plurality of conventional laser fuse links in their unblown (i.e., conductive) state;

FIG. 2B depicts the laser fuse links of FIG. 2A in their blown (i.e., nonconductive) state;

FIGS. 3A and 3B illustrate a plurality of laser fuse links on a substrate, including the laser spots formed thereon after the fuse setting operation;

FIGS. 8A–8E illustrate a third embodiment of the invention having a reflective layer beneath the fusible link;

FIGS. 9A–9E illustrate a method of forming the third embodiment of the invention.

DETAILED DESCRIPTION OF PREFERRED EMBODIMENTS

Figure 4A:
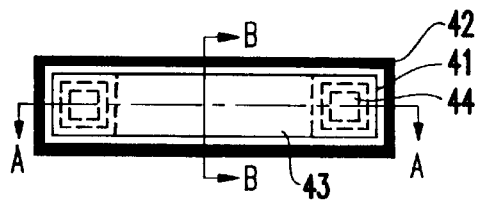
FIGS. 4A–4D illustrate a first embodiment of the invention including a reflective layer surrounding the fusible link.

The present invention will now be described in detail with reference to embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, laser fuse links are furnished underneath and along the sides with reflective material. The laser fuse links are used in, for example, integrated circuits (ICs) to enable connections in order to achieve the desired functionality. Such ICs include memory circuits like, for example, random access memories (RAMs), dynamic RAMs (DRAMs), synchronous DRAMs (SDRAMs), static RAMs (SRAMs), and read only memories (ROMs). Other ICs include logic devices such as programmable logic arrays (PLAs), application specific ICs (ASICs), or any circuit devices.

Typically, a plurality of ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and others. To aid in understanding of the invention, it is described in the context a single chip and, more particularly, to a RAM chip.

By providing reflective material surrounding the fuse links, the adjacent fuses and devices below the fuses are protected from laser-induced damage when a laser beam is employed to open a given laser fuse links. In one embodiment, the laser fuse links are insulated from the surrounding shielding portion by a dielectric layer. With reduced damage to adjacent fuse links and underlying layer, the areas underlying the laser fuse links and the shielding portions may be employed to implement semiconductor devices (e.g., transistors, capacitors, and the like), thereby increasing circuit density. Further, with the invention, fuse links may be more closely spaced (e.g., lower pitch), which increases the fuse link density, because adjacent fuses are prevented from being damaged.

The provision of the shielding portions surrounding the sides and lower portion of the laser fuse links also facilitates the use of lasers whose wavelengths may be shorter than the wavelength of conventional systems infrared laser. If such shorter wavelength lasers were employed on prior art laser fuse links, excessive damage to the underlying substrate and adjacent fuse links may occur due to the excessive absorption of laser energy. With the inventive reflective portions in place, the excess laser energy is either reflected away from the underlying areas or is absorbed by the reflective portions themselves, thereby minimizing laserinduced damage to the areas underlying and adjacent to the fuse links.

The shorter wavelength laser beams produce a smaller laser footprint which will overlap less area during the opening of a given fuse. Since laser beams having shorter wavelengths may be employed with the invention, adjacent laser fuse links may be packed more closely together, thereby increasing circuit density. By way of example, the use of shorter wavelength laser beams permits a greater number of fuse links to be implemented with the redundant array of the DRAM, thereby increasing the number of redundant array elements available for replacing defective main memory array elements.

The features and advantages of the present invention may be better appreciated with reference to the figures and discussion below.

The invention includes a reflective layer in close proximity to the fusible link, to focus more of the laser energy toward the fusible link.

Figure 4B:
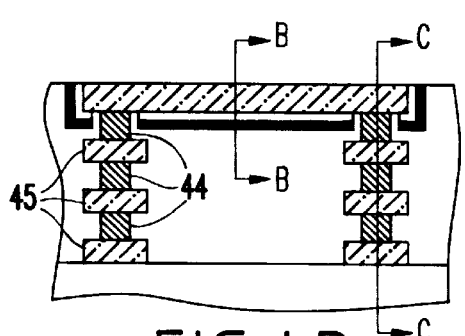
Figure 4C:
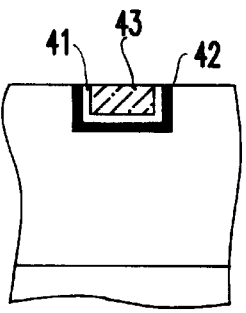
Figure 4D:
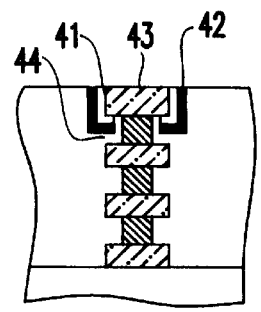

Referring now to FIGS. 4A–4D, a first embodiment of the invention is illustrated. FIG. 4A is a top view of the structure of the first embodiment. FIG. 4B is a side view thru section AA of FIG. 4A. FIG. 4C is an end view thru section BB of FIGS. 4A and 4B. FIG. 4D is an end view thru section CC of FIG. 4B.

The first embodiment includes an entire fusible link 43 structure surrounded by a reflective layer 42 which is separated from the link 43 by a thin insulating layer 41. FIG. 4B also illustrates conductive vias (studs) 44 connecting metalization layers 45. The fusible link 43 selectively joins the vias 44.

More specifically, as shown in FIGS. 4A and 4C, reflective material 42 substantially surrounds the bottom and sides of the fusible link 43. However, as illustrated in FIGS. 4B and 4D, in the regions of the vias 44, the reflective material 42 is discontinuous along the lower portion of the fusible link (e.g., has openings there through) to allow the via 44 to contact the fusible link.

In this embodiment, the fusible link 43 is insulated from the fuse 43 by an insulating layer 41. Without the insulating layer 41, the reflective material 42 may act as a conductor and continue a connection across the fusible link even after the fusible link is blown.

In general, the reflective layer 42 is preferably formed of a material that reflects substantially all of the laser energy impacted upon and which has a relatively high melting point (compared to the melting point of the laser fuse link). However, materials having a substantially similar or even a lower melting point than that of the fusible link may also be employed as they may be appropriately sized to reflect or absorb enough of the laser energy to protect the adjacent structures.

Two materials that are especially suitable for the reflective layer are silver (with a melting point 960° C. and reflectivity of 96% at 1.0 mm) and rhodium (with a melting point 1966° C. and reflectivity or 84% at 1.0 mm). Gold is also preferable as a reflective layer, having a melting point 2600° C. and reflectivity of 95% at 1.0 mm. These materials are especially reflective when deposited by electroplating, but could be evaporated. Other preferred reflective layer materials include copper, platinum (melting point 1773° C. and a reflectivity of 73% at 1.0 mm), tantalum, and nickel. Additionally, certain metallic oxides, such as zirconium oxide 84% and aluminum oxide 88%, would also be useful as reflectors.

However, an important distinction between the invention and conventional structures is that the reflective layer 42 has a very high reflective quality and has a melting point which is substantially higher than (e.g., 1.45 times for an Al fuse with a Ag reflector to about 3 times for an Al fuse with a Ro reflector) the melting point of the fusible link.

The thickness of the reflective layer 42 will vary depending upon application. However, a preferred thickness of the reflective layer is within the range of 200 to 2500 angstroms.

With respect to the material used for the fusible link, conventional aluminum has a melting point of 659° C. and a reflectivity of 71% at 1.0 $\mu$m and is easily blown with a laser. Thus, the laser fuse links are preferably formed of aluminum or one of its alloys, or they may be formed of any other suitable fuse materials (e.g., polysilicon).

However, a material such as copper has a melting point of 1083° C. and a reflectivity of 90% at 1.0 $\mu$m. Both the higher temperature and greater reflectivity of copper make blowing a copper fuse with a laser more difficult and makes copper and unattractive choice as a fusible link. Similarly, tungsten, with a melting point 3370° C. and reflectivity of 62% at 1.0 mm is not a good choice of fusible link material because of its high melting point. Tantalum, with a melting point 2996° C. and reflectivity of 78% at 1.0 mm, is also a poor selection as a fusible link material because of its high melting point and reflectivity.

Additionally, the thickness of the fusible link will vary according to the specific application involved. However, a preferred thickness of the fusible link this in the range 3000 to 5000 angstroms for aluminum with an upper limit of about 1 micron. An increase in thickness of the fusible link can create a problem because as the fusible link becomes thicker, it is more difficult for the laser to melt the bottom most portion of the fusible link.

Another key element is the thickness and material of the insulating layer between the fusible link and the reflecting layer. Suitable materials include deposited oxides and nitrides of silicon. The thickness of the insulating layer enhances or reduces the effectiveness of the reflective layer.

More specifically, if the reflective layer has a thickness that is an even sub-multiple (e.g., ¼, ½, ¾, etc.) of the laser wavelength, destructive interference will occur and essentially none of the laser energy will be reflected back to the fusible link. To the contrary, if the thickness of the reflective layer is a whole multiple (e.g., 1, 2, 3, etc.) there will be no interference and the effectiveness of the reflective layer will be at a maximum.

Therefore, by controlling the thickness of the insulating layer, the amount of laser light energy which is concentrated on the fusible link can be selectively controlled. By maximizing the effectiveness of the reflective layer, a lower energy laser beam may be utilized, decreasing the likelihood of laser induced damage and allowing the fuses to be more closely spaced.

Figure 5A:
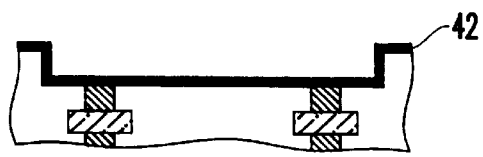
FIGS. 5A–5F illustrate a method for forming the second embodiment of the invention.
Figure 5B:

FIGS. 5A–5F illustrate a first inventive method relating to the first embodiment. More specifically, FIG. 5A illustrates the formation of the reflective layer 42. In FIG. 5B, the insulating layer 41 is formed. As would be known by one ordinarily skilled in the art given this disclosure, the reflective layer 42 and insulating layer 41 can be formed by a number of techniques, such as electroplating and evaporation.

Figure 5C:
Figure 5D:
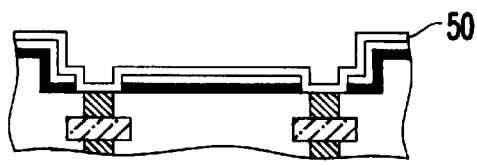
Figure 5E:

In FIG. 5C, the reflective layer 42 and the insulating layer 41 are selectively etched using well known methods, such as etching with sacrificial masks, and other similar methods well known to those ordinarily skilled in the art, to expose the vias 44.

Insulating sidewall spacers 50 are also formed using well known methods, such as deposition (shown in FIG. 5D) and etching of horizontal surfaces (shown in FIG. E). As would be known by one ordinarily skilled in the art given this disclosure, etching processes, such as reactive ion etching (RIE), are useful for removing layers from only the horizontal surfaces, leaving vertical sidewall spacers. The sidewall spacers 50 can be formed of the same or different material as the insulating layer 41, depending upon the specific application involved. The sidewall spacers 50 serve to further insulate the reflective layer 42 from the fusible link 43.

Figure 5F:
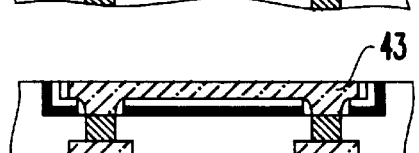

FIG. 5F illustrates the formation of the fusible link material 43 which electrically connects the vias 44. As discussed above, the fusible link can be formed using a number of well known conventional methods, such as electroplating or evaporation.

This embodiment of the invention protects the fusible link 43 from light reflected from adjacent fuses. Further, the invention reflects light scattered from the sidewalls 42 back to the fusible link 43 and reflects light that would otherwise be lost from under the link 43 to increase the efficiency of the laser light and to decrease damage to surrounding structures. This embodiment is especially useful for tightly spaced thick or composite fuses.

Figure 6A:
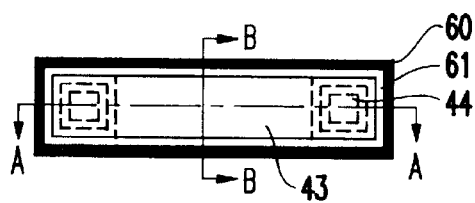
FIGS. 6A–6D illustrate a second embodiment of the invention including a reflective layer adjacent the sides of the fusible link.
Figure 6B:
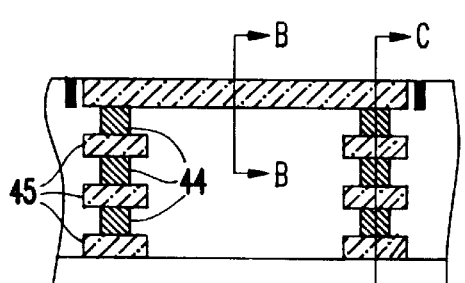

Referring now to FIGS. 6A–6D, a second embodiment of the invention is illustrated. The second embodiment is somewhat similar to the first embodiment and the same structures have been given the same identification numbers and a redundant discussion thereof is omitted. More specifically, FIGS. 6A and 6B illustrate a fusible link 43, vias 44, metalization layers 45, an insulating layer 61 and a reflective layer of 60. The materials utilized for the various layers are the same as those discussed above with regard to the first embodiment and, again, a redundant discussion thereof is omitted.

Figure 6C:
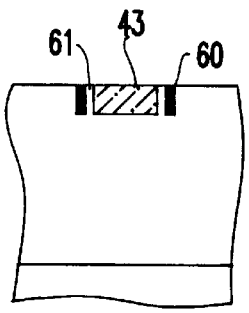
Figure 6D:
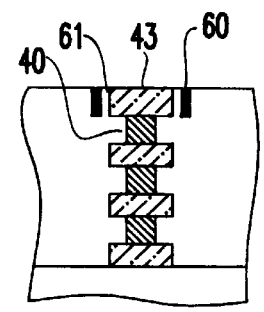

As shown in FIGS. 6C and 6D, the second embodiment is different than the first embodiment because of the reflective layer 60 and insulating layer 61 are positioned only along the sides of the fusible link 43.

In the second embodiment only the sides of the fusible link 43 structure are surrounded by the reflective layer 60 which is separated from the link 43 by the thin insulating layer 61. This embodiment protects the fuse from light from adjacent fuses and reflects light scattered from the sidewalls of the link back to the link and is useful for tightly spaced and or thick fuses especially.

Figure 7A:
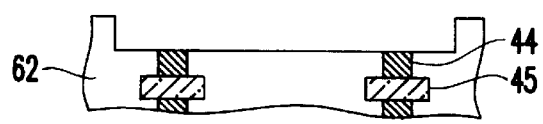
FIGS. 7A–7F illustrate a method for forming the second embodiment of the invention.

FIGS. 7A–7F illustrate a method for forming the second embodiment. More specifically, FIG. 7A illustrates the etching of a substrate 62, using well known methods, such as selective etching using a sacrificial mask layer, to etch a groove which spans two vias 44.

Figure 7B:
Figure 7C:
Figure 7D:
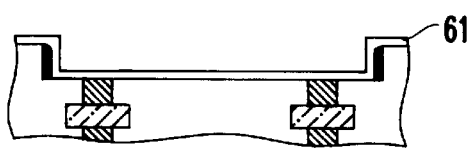

FIG. 7B illustrates the deposition of the reflective layer 60 and FIG. 7C illustrates the reflective layer 60 after a selective horizontal etching process has been completed. FIG. 7D illustrates the deposition of the insulating layer 61 and FIG. 7E illustrates the selective removal of the insulating layer from horizontal surfaces.

Figure 7E:
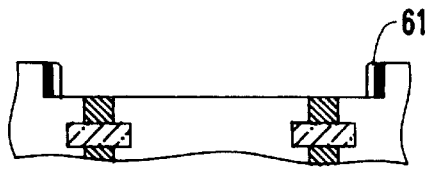
Figure 7F:
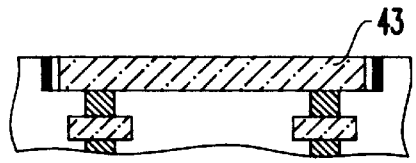

As discussed above, etching processes, such as reactive ion etching (RIE), are useful for removing layers from only the horizontal surfaces, leaving vertical spacers, such as the reflective layer 60, illustrated in FIG. 7C and the insulating layer 61 illustrated in FIG. 7E. Lastly, FIG. 7F illustrates the deposition of the fusible link 43 which creates an electrical connection between the vias 44.

While this embodiment does not provide direct protection under the fuse, it does provide direct protection to adjacent fuses and offers some reduction in energy requirements due to reflection back from the sides that would otherwise be lost. The chief benefits of this embodiment is reduced processing steps, less complicated structure, especially for the via connection, and lower potential for contacting and shorting with the reflector.

FIGS. 8A–8E illustrate a third embodiment of the invention. Again, the same structures have been given the same identification numbers and a redundant discussion of the same day has been omitted.

The third embodiment of the invention includes a reflective layer 80 positioned below the fusible link 43 and an insulating layer 81 insulating the reflective layer 80 from the fusible link 43. As illustrated in FIG. 8B, the reflective layer 80 exists only under the fusible link 43.

Different applications of this embodiment are illustrated in FIGS. 8C and 8E. In FIG. 8C, the reflective layer 82 has a width substantially equal to the width of the fusible link 43 and is centered beneath the fusible link 43.

This embodiment eliminates the need for a thin insulator and still provides direct protection under the fuse. The process is less complicated than the process of the first embodiment and places the reflector a greater distance from the fuse, reducing the risk of damage to the reflector. A reflector of the same width as the fuses, allows for increased fuse density and tends to reflect light back only to the target fuse.

To the contrary, FIG. 8E illustrates a reflective layer 83 which has a width substantially larger than the width of the fusible link 43 and extends outward beyond the edges of the fusible link. For example, the width of the reflective layer 83 is preferably 1.5 to 2 times as wide as the fusible link 43 and is centered directly under the fusible link 43. This embodiment reflects light that would be lost from under the link and is used with especially for thick fuses or those having refractory layers on the bottom of the stack are used.

FIGS. 9A–9E illustrate a method of forming the third embodiment of the invention. More specifically, FIG. 9A illustrates a groove 90 which has been etched in a substrate 91 using methods described above with respect to the previous embodiments.

As with the previous embodiments, a reflective layer 80 is deposited, as shown in FIG. 9B and the structure is planarized using well known methods such as polishing and other similar methods, to form the structure illustrated in FIG. 9C.

An insulating layer 81 is deposited above the reflective layer 80, as illustrated in FIG. 9D, using well known methods discussed above. Finally, in FIG. 9E, the fusible link 43 is deposited, as with the previous embodiments, above the insulating layer 81 to connect the vias 44.

As mentioned, infrared lasers are typically employed in conventional systems since the use of lasers having shorter wavelengths tends to cause unacceptable damage to the underlying substrate due to excessive energy absorption.

Figure 10:
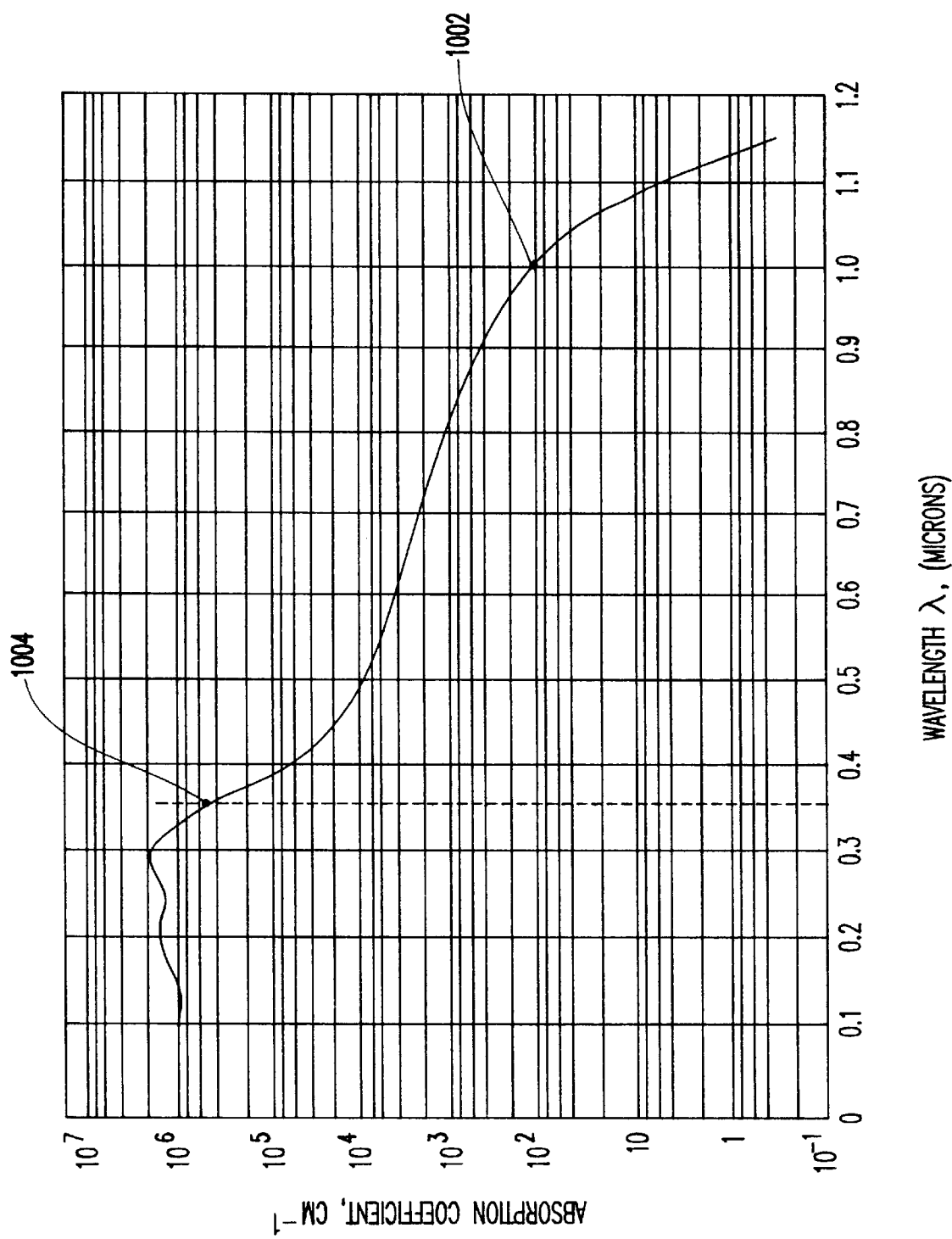
FIG. 10 illustrates the absorption coefficients of a silicon substrate for different wavelengths of light.

The relationship between energy absorption and laser wavelengths for silicon is shown in the plot of FIG. 10. Energy absorption by the silicon substrate increases dramatically as the laser wavelength decreases. At about 1 micron, which is about the wavelength of prior art infrared lasers, the absorption coefficient is shown to be about 100/cm (point 102). For UV lasers, whose wavelengths may be about 0.35 micron, the absorption coefficient is shown to be about 40,000/cm (point 104). Other substrate materials, such as gallium arsenide GaAs, exhibit a similar trend. Accordingly, the inventive fuse fabrication techniques disclosed herein apply to other such similar substrates as well.

Because energy absorption increases logarithmically with decreasing wavelength, the trend in conventional systems has been to employ lasers having longer wavelengths, even longer than wavelengths associated with prior art infrared lasers in some cases, to reduce energy absorption and damage of closely spaced structures. The invention takes the opposite approach and facilitates the use of lasers having shorter wavelengths while substantially minimizing potential damage to adjacent structures and the underlying substrate. With the inventive reflective layers 42, 60, 80, 82, 83, it is possible to employ, for example, sub-infrared lasers, ultraviolet lasers, visible lasers such as green lasers, blue lasers, red lasers, and the like in setting the laser fuse links.

The present invention provides for more efficient use of available laser energy. The invention reduces the number of pulses required in multipluse environments, because the energy is used more efficiently. Because the energy may be lower with the invention, fuses may be packed more densely as the risk of adjacent fuse damage is reduced. Thicker fuse material or composite fuse materials may be utilized with the invention without increasing laser energy, number of pulses, or increasing the risk of damage. Application of the invention to composite fuse materials allows newer materials to be used for fuses. For example, a composite of a thick upper metal with a thin lower refactory metal (and thin sidewall coating as in liner processes) can be more easily blown as some laser energy will impinge on the underside of the fuse directly on the lower metal which is otherwise difficult to melt.

While the invention has been described in terms of preferred embodiments, those skilled in the art will recognize that the invention can be practiced with modification within the spirit and scope of the appended claims.

What is claimed is:

1. An integrated circuit fuse structure for selectively making an electrical connection comprising:
   a conductive element, wherein said conductive element becomes non-conductive after application of radiation energy; and
   a metallic reflective element, positioned adjacent at least two sides of said conductive element for reflecting said radiation energy.

2. The structure in claim 1, wherein said conductive element comprises a laser fusible link, wherein said radiation energy comprises laser light.

3. The structure in claim 1, wherein said reflective element substantially surrounds opposing sides and a bottom of said conductive element.

4. The structure in claim 1, wherein said reflective element is positioned around opposing sides of said conductive element.

5. The structure in claim 1, wherein said conductive element has a first melting point and said reflective element has a second melting point higher than said first melting point.

6. The structure in claim 1, wherein said conductive element comprises one of aluminum, an aluminum alloy and polysilicon.

7. The structure in claim 1, wherein said reflective element comprises one of silver, rhodium, gold, copper, platinum, tantalum, nickel, zirconium oxide, aluminum oxide, and aluminum oxide.

8. The structure in claim 1, further comprising an insulating layer positioned between said conductive element and said reflective element.

9. The structure in claim 8, wherein said insulating layer has a thickness equal to a whole multiple of a wavelength of said radiation energy.

10. A dynamic random access memory structure comprising:
    a main memory array;
    a conductive element electrically connected to said main memory array, wherein said conductive element becomes non-conductive after application of radiation energy;
    a redundant memory array selectively connected to said main memory array by said conductive element; and
    a metallic reflective element, positioned adjacent at least two sides of said conductive element for reflecting said radiation energy.

11. The dynamic random access memory structure in claim 10, wherein said conductive element comprises a laser fusible link, wherein said radiation energy comprises laser light.

12. The dynamic random access memory structure in claim 10, wherein said reflective element substantially surrounds opposing sides and a bottom of said conductive element.

13. The dynamic random access memory structure in claim 10, wherein said reflective element is positioned around opposing sides of said conductive element.

14. The dynamic random access memory structure in claim 10, wherein said conductive element has a first melting point and said reflective element has a second melting point higher than said first melting point.

15. The dynamic random access memory structure in claim 10, wherein said conductive element comprises one of aluminum, an aluminum alloy and polysilicon.

16. The dynamic random access memory structure in claim 10, wherein said metallic reflective element comprises one of silver, rhodium, gold, copper, platinum, tantalum, nickel, zirconium oxide 84, and aluminum oxide.

17. The dynamic random access memory structure in claim 10, further comprising an insulating layer positioned between said conductive element and said reflective element.

18. The dynamic random access memory structure in claim 17, wherein said insulating layer has a thickness equal to a whole multiple of a wavelength of said radiation energy.

19. A method of forming an integrated circuit fuse structure for selectively making an electrical connection comprising:
    forming a metallic reflective element and a conductive element on a substrate such that said reflective element is adjacent at least two sides of said conductive element, said conductive element becoming non-conductive after application of radiation energy, said reflective element reflecting said radiation energy.

20. The method in claim 19, wherein said conductive element is formed as a laser fusible link, wherein said radiation energy comprises laser light.

21. The method in claim 19, wherein said reflective element is formed to substantially surround opposing sides and a bottom of said conductive element.

22. The method in claim 19, wherein said reflective element is formed around opposing sides of said conductive element.

23. The method in claim 19, wherein said conductive element is formed to have a first melting point and said reflective element is formed to have a second melting point higher than said first melting point.

24. The method in claim 19, further comprising forming an insulating layer between said conductive element and said reflective element.

25. The method in claim 24, wherein said insulating layer is formed to have a thickness equal to a whole multiple of a wavelength of said radiation energy.

26. A method of selectively making an electrical connection in a dynamic random access memory structure comprising:

forming a metallic reflective element and a conductive element on a substrate such that said reflective element is adjacent at least two sides of said conductive element; and selectively applying radiation energy to said conductive element to make said conductive element non-conductive, said reflective element reflecting said radiation energy.

27. The method in claim 26, wherein said conductive element is formed as a laser fusible link, wherein said radiation energy comprises laser light.

28. The method in claim 26, wherein said reflective element is formed to substantially surround opposing sides and a bottom of said conductive element.

29. The method in claim 26, wherein said reflective element is formed around opposing sides of said conductive element.

30. The method in claim 26, wherein said conductive element is formed to have a first melting point and said reflective element is formed to have a second melting point higher than said first melting point.

31. The method in claim 26, further comprising forming an insulating layer between said conductive element and said reflective element.

32. The method in claim 31, wherein said insulating layer is formed to have a thickness equal to a whole multiple of a wavelength of said radiation energy.

* * * * *

UNITED STATES PATENT AND TRADEMARK OFFICE
CERTIFICATE OF CORRECTION

PATENT NO.: 6,160,302

DATED: December 12, 2000

INVENTORS: Anthony M. Palagonia

It is certified that an error appears in the above-identified patent and that said Letters Patent is hereby corrected as shown below:

Claim 7, end of sentence, add --silicon and polysilicon.---
Claim 16, end of sentence, add --silicon and polysilicon.---

Signed and Sealed this

Twenty-ninth Day of May, 2001

NICHOLAS P. GODICI

*Attest:*

*Attesting Officer*    Acting Director of the United States Patent and Trademark Office